(12) United States Patent
Nitta

(10) Patent No.: US 6,278,136 B1
(45) Date of Patent: Aug. 21, 2001

(54) SEMICONDUCTOR LIGHT EMITTING ELEMENT, ITS MANUFACTURING METHOD AND LIGHT EMITTING DEVICE

(75) Inventor: Koichi Nitta, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/063,383

(22) Filed: Apr. 21, 1998

(30) Foreign Application Priority Data

Apr. 22, 1997 (JP) ..................................... 9-104327

(51) Int. Cl.$^7$ ................................................. H01L 33/00
(52) U.S. Cl. ................ 257/99; 257/91; 257/93; 257/97; 257/103; 372/45
(58) Field of Search .................. 257/99, 91, 93, 257/97, 103; 372/45

(56) References Cited

U.S. PATENT DOCUMENTS

| | | | |
|---|---|---|---|
| 4,739,379 | * 4/1988 | Akagi | 257/198 |
| 4,903,104 | * 2/1990 | Kawai | 257/198 |
| 4,987,468 | * 1/1991 | Thornton | 257/198 |
| 5,557,115 | * 9/1996 | Shakuda | 257/99 |
| 5,745,517 | * 4/1998 | Bour | 372/45 |
| 5,866,922 | * 2/1999 | Huang | 257/103 |
| 5,929,466 | * 7/1999 | Ohba | 257/103 |

FOREIGN PATENT DOCUMENTS 5-291621   11/1993  (JP) .

OTHER PUBLICATIONS

Nakamura, Shuji et al.; Article: P–GaN/N–InGaN/N–GaN Double–Heterostructure Blue–Light–Emitting Diodes, Jpn. J. Appl. Phys., vol. 32 (1993) pp. L8–L11.

Amano, Hiroshi et al.; Article: P–Type Conduction in Mg–Doped GaN Treated with Low–Energy Electron Beam Irradiation (LEEBI), Jpn. J. Appl. Phys., vol. 28, No. 12, Dec. 1989, pp. L2112–L2114.

\* cited by examiner

Primary Examiner—Jerome Jackson, Jr.
(74) Attorney, Agent, or Firm—Finnegan, Henderson, Farabow, Garrett, & Dunner, L.L.P.

(57) ABSTRACT

A light emitting element includes a multi-layered structure including an n-type nitride compound semiconductor layer and a p-type nitride compound semiconductor layer stacked on a substrate, and the multi-layered structure has formed an n-type region extending through the p-type semiconductor layer down to the n-type semiconductor layer to permit the p-side electrode and the n-side electrode to be formed on a common plane. A high-resistance region may be formed to surround the n-type region in order to more effectively block a leak current produced between the n-type region and the p-type nitride compound semiconductor. The light emitting element therefore includes no step on its surface, which simplifies the wafer process and contributes to wider applications of the semiconductor light emitting elements.

7 Claims, 7 Drawing Sheets

SEMICONDUCTOR LIGHT EMITTING ELEMENT, ITS MANUFACTURING METHOD AND LIGHT EMITTING DEVICE

BACKGROUND OF THE INVENTION

This invention relates to a semiconductor light emitting element, its manufacturing method and a light emitting device. More specifically, the invention relates to a light emitting element, its manufacturing method and a light emitting device in which the p-side electrode and the n-side electrode of a light emitting element using nitride compound semiconductors are formed on a common plane to obtain a high performance and high integration and to simplify the manufacturing and assembling process.

Semiconductor light emitting elements have advantageous features, namely, compactness, high reliability, high efficiency, and capability of emitting light in a wide wavelength range from the infrared range to the blue-violet range when appropriate materials are chosen. Making the best use of these features, they are widely used regardless of the industrial use or civil use.

Made below is a review of light emitting elements using nitride compound semiconductors among such semiconductor light emitting elements. Throughout the specification, the nitride compound semiconductors pertain to any semiconductors with all varieties of mole fractions x and y from zero to 1 in the chemical formula $In_xAl_yGa_{1-x-y}N$ $0 \leq x \leq 1$, $0 \leq y \leq 1$, x+y=1). For example, GaN (x=0, y=0) is also one of nitride compound semiconductors.

Nitride compound semiconductors are III-V compound semiconductors of direct transition type, whose band gaps can be varied from 1.89 to 6.2 eV by controlling their mole fractions x and y, and are remarked as hopeful materials of LED (light emitting diodes) and semiconductor lasers. Especially, if they successfully emit highly luminous light in the blue wavelength range, it is possible to double the recording capacity of various optical disks and to provide full color displays. From these expectations, blue light emitting elements using $In_xAl_yGa_{1-x-y}N$ semiconductors have been used to improve initial characteristics and reliability.

Referential documents disclosing conventional blue light emitting elements using nitride compound semiconductors involve Jpn. J. Appl. Phys., 28(1989) p.L2 112, Jpn. J. Appl. Phys., 32(1993) p. L8, and Japanese Patent Laid-Open Publication 5-291621.

FIG. 8 is a schematic cross-sectional view of a conventional blue light emitting element.

Its construction is roughly explained below.

The light emitting element 100 has a multi-layered structure stacking semiconductors on a sapphire substrate 102. More specifically, stacked on the sapphire substrate 102 are a buffer layer 104, n-type contact layer 106, active layer 108, and p-type contact layer 110 in this order.

The stacked structure is partly removed by etching to form a step where the n-type contact layer 106 is partly exposed. The n-side electrode 120 is formed on the exposed surface of the n-type contact layer 106, and the p-side electrode 130 is formed on the p-type contact layer 110. A reason of etching the structure to the n-type contact layer 106 to form the n-side electrode lies in that the sapphire substrate 102 has an electrically insulating property.

The buffer layer 104 may be made of GaN, for example. The n-type contact layer 106 is an n-type semiconductor layer having a high carrier concentration enough to ensure ohmic contact with the n-side electrode 120, and may be made of, for example, AlGaN doped with silicon (Si). The active layer 108 is a semiconductor layer where electric charges injected as a current into the light emitting element recombine and emit light. Usable as its material is, for example, $In_xAl_yGa_{1-x-y}N$ doped with zinc (Zn). The p-type contact layer 110 is a p-type semiconductor layer having a high carrier concentration to ensure its ohmic contact with the p-side electrode, and may be made of, for example, AlGaN doped with magnesium (Mg).

When a current is injected to the light emitting element, light in the blue wavelength range is emitted in the active layer 108 having luminescent centers in zinc (Zn).

However, since the conventional blue light emitting element shown in FIG. 8 makes the n-side electrode 120 on the surface of the n-type contact layer 106, it needs the process of etching the structure to the depth of the n-type contact layer 106. Moreover, the n-side electrode 120 must be made on the bottom surface of a step formed by the etching. That is, it is necessary to stack materials of the n-side electrode 120 on the bottom surface of the step and to pattern it appropriately. This process is not easy, and are apt to decrease the yield.

Another problem of the conventional element lies in that the light emitting element 100 has a step and has the n-side electrode 120 and the p-side electrode in different levels, which results in requiring positional adjustment to respective levels of the electrodes and therefore complicating the process. In the step of wire bonding to the n-side electrode 120, a bonding tool for supplying the wire may bump against the side surface of the step (shown at S in FIG. 8). To avoid this, the bottom surface of the step must be enlarged. It cause another problem, namely, an increase of the element size and the manufacturing cost.

Conventional light emitting elements having the n-side electrode and the p-side electrode in different levels, and not on a common plane, made so-called flip-chip mounting difficult. Another problem, therefore, is that light emitting elements could not be used to various applications relying on flip-chip mounting and that it was difficult to provide improvements of electric, optical characteristics and reduction of the packaging size.

All these problems with conventional techniques as explained above are caused by the step-containing structure of conventional gallium nitride light emitting elements.

SUMMARY OF THE INVENTION

It is therefore an object of the invention to provide a semiconductor light emitting element having no step and having formed the n-side electrode and p-side electrode on a common plane to simplify the wafer process and to enlarge the range of its applications, and to provide a method for manufacturing the light emitting element.

According to the invention, there is provided a semiconductor light emitting element comprising:

a multi-layered structure including at least a substrate, a nitride compound semiconductor layer of a first conduction type formed on the substrate, and a nitride compound semiconductor layer of a second conduction type formed on the first conduction type nitride compound semiconductor, and further including a first conduction type region made by selectively introducing a first conduction type dopant from a selective area of the surface of the second conduction type nitride compound semiconductor to extend from the surface of the multi-layered structure to the first conduction type nitride semiconductor layer;

a first electrode formed in contact with the surface of the first conduction type region of said multi-layered structure; and a second electrode formed in contact with the surface of the second conduction type nitride compound semiconductor.

A specific version of the multi-layered structure includes a substrate, an n-type conduction layer made of an n-type nitride semiconductor on the substrate, an n-type cladding layer made of an n-type nitride compound semiconductor on the n-type conduction layer, an active layer made of a nitride compound semiconductor on the n-type cladding layer, a p-type cladding layer made of a p-type nitride compound semiconductor on the active layer, and a p-type contact layer made of a p-type nitride compound semiconductor on the p-type cladding layer.

Elements used as dopants of respective layers, thicknesses of respective layers and other parameters can be optimized appropriately.

When a high-resistance region is formed to surround the first conduction type region, leak current can be blocked effectively.

According to the invention, there is also provided a method for manufacturing a semiconductor light emitting element, comprising the steps of:

stacking at least one layer of an n-type nitride compound semiconductor and at least one p-type nitride compound semiconductor layer in the cited order on a substrate;

selectively introducing an n-type dopant from a selective area of the surface of the p-type nitride compound semiconductor layer to form an n-type region extending at least to the n-type nitride compound semiconductor layer;

forming a first electrode on the surface of the n-type region; and forming a second electrode on the surface of the p-type nitride compound semiconductor.

The invention is used in the above-described modes, and attains the effects explained below.

The invention removes the need for making a step for making the n-side electrode. Therefore, the step of etching the semiconductor multi-layered structure to make such a step can be omitted. The configuration with no step facilitates the steps for stacking and patterning the n-side electrode, and improves the production yield.

The invention makes it possible to locate the p-side electrode and the n-side electrode on a common plane, and this makes wire bonding to the light emitting element easier and improves the assembling yield.

Additionally, the invention makes flip-chip packaging possible. Therefore, the light emitting element can be packaged and bonded directly on a packaging substrate without using bonding wires, and it remarkably simplifies the assembling step. Driving loads such as electric resistance, electric capacity and inductance are reduced to ensure high-speed driving of the light emitting element. Additionally, since no bonding wire is used, the life of the light emitting element against mechanical vibrations, or the like, is remarkably improved, and its reliability is improved. Simultaneously, applications of the light emitting elements are enlarged much wider. For example, a number of light emitting elements can be packaged on a packaging substrate in a high-density integration to obtain high-performance optical interfaces and high-quality image display devices.

Moreover, the invention removes the need for making a separation groove between the n-type region and the p-side region to insulate them from each other. That is, remaking p-type gallium nitride semiconductors having low specific resistance, the invention can optimize the element structure as described above to block leak current components. Therefore, the semiconductor elements needs no separation groove, and it contributes to simplifying the element structure and its manufacturing process.

As shown above, the invention enables a high productivity of semiconductor light emitting elements with a high performance and a high reliability in a very simple manufacturing process, and its industrial merits are great.

BRIEF DESCRIPTION OF THE DRAWINGS

The present invention will be understood more fully from the detailed description given hereinbelow and from the accompanying drawings of the preferred embodiments of the invention. However, the drawings are not intended to imply limitation of the invention to a specific embodiment but are for explanation and understanding only.

In the drawings.

DETAILED DESCRIPTION OF THE PREFERRED EMBODIMENTS

The invention is essentially characterized in forming an n-type region extending through and beyond a p-type nitride compound semiconductor layer to an n-type nitride compound semiconductor layer in a multi-layered structure of the n-type semiconductor layer and the p-type semiconductor layer stacked on a substrate so as to permit its p-side electrode and n-side electrode to be formed on a common plane.

When a high-resistance region is formed around the n-type region, leakage of a current between the n-type region and the p-type nitride compound semiconductor can be restricted effectively.

Explained below are embodiments of the invention with reference to the drawings.

Figure 1A:
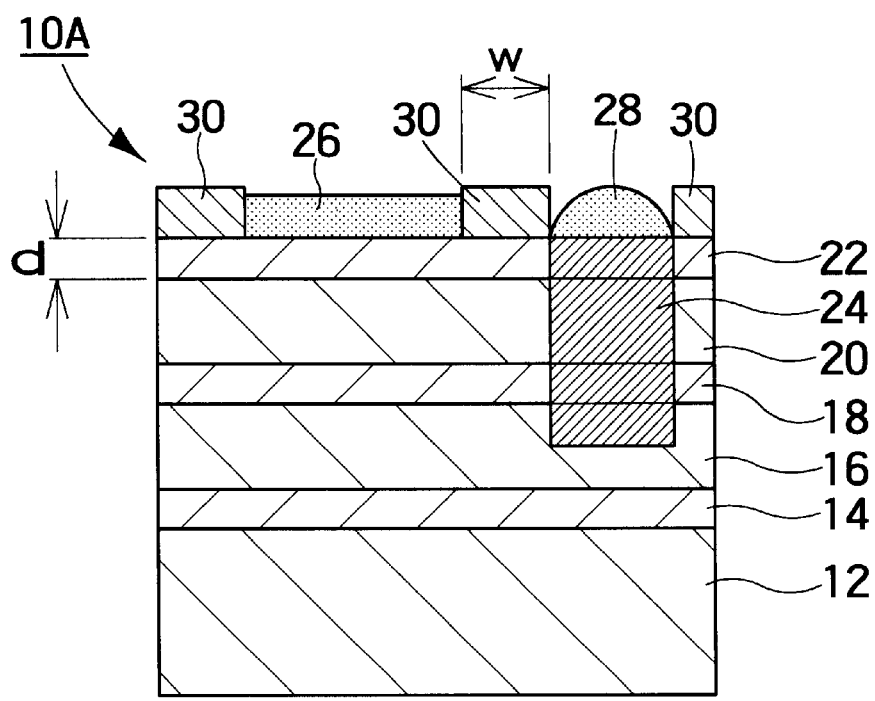
FIGS. 1A and 1B are cross-sectional views showing general constructions of semiconductor light emitting elements according to the invention.
Figure 1B:
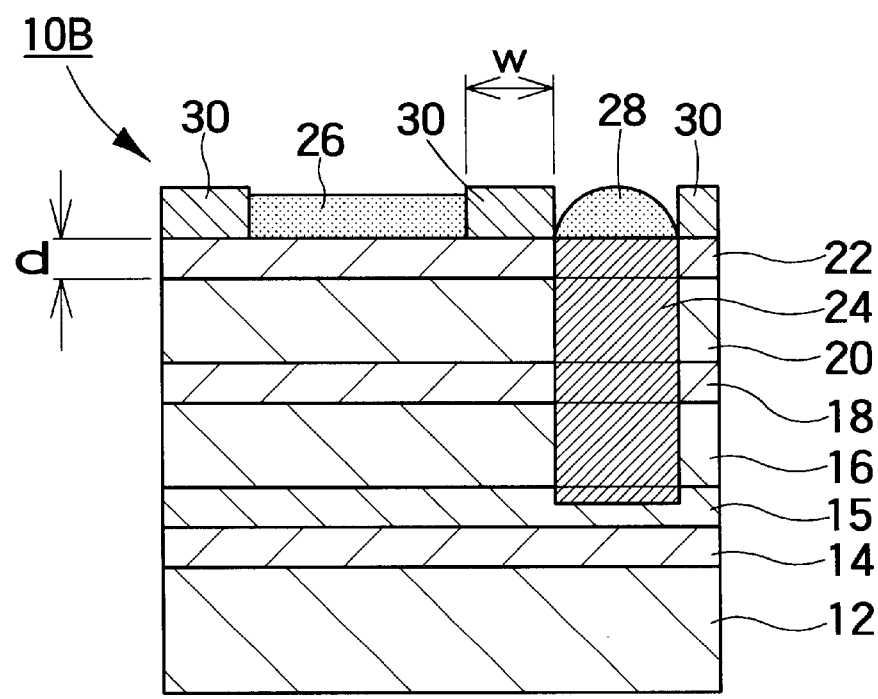

FIGS. 1A and 1B are cross-sectional views schematically showing semiconductor light emitting elements embodying the invention.

A light emitting element 10A is a nitride compound semiconductor light emitting element which emits light in the range of ultraviolet to red wavelength bands, and has a multi-layered structure of semiconductors stacked on a sapphire substrate 12. More specifically, stacked on the sapphire substrate 12 are stacked a buffer layer 14, n-type cladding layer 16, active layer 18, p-type cladding layer 20 and p-type contact layer 22 in the cited order.

The buffer layer 14 may be made of, for example, n-type, p-type or undoped $In_{x1}Al_{y1}Ga_{1-x1-y1}N$ ($0 \leq x1 \leq 1$, $0 \leq y1 \leq 1$). The n-type cladding layer 16 is an n-type semiconductor layer having a high carrier concentration, and may be made of, for example, $In_{x2}Al_{y2}Ga_{1-x2-y2}N$ ($0 \leq x2 \leq 1$, $0 \leq y2 \leq 1$). The active layer 18 is a semiconductor layer where electric charges injected as a current into the light emitting element recombine and emit light. It may be made of, for example, $In_{x3}Al_{y3}Ga_{1-x3-y3}N$ ($0 \leq x3 \leq 1$, $0 \leq y3 \leq 1$). The p-type cladding layer 20 is a p-type semiconductor layer which forms a pn junction with the n-type layer 16 beyond the active layer, and may be made of, for example, $In_{x4}Al_{y4}Ga_{1-x4-y4}N$ ($0 \leq x4 \leq 1$, $0 \leq y4 \leq 1$). The p-type contact layer 22 is a p-type semiconductor layer having a higher carrier concentration enough to ensure ohmic contact with the p-side electrode, and may be made of, for example, $In_{x5}Al_{y5}Ga_{1-x5-y5}N$ ($0 \leq x5 \leq 1$, $0 \leq y5 \leq 1$). The n-type cladding layer 16 and the p-type cladding layer 20, when made of semiconductors having wider band gaps than that of the active layer 18, can efficiently confine injected carriers within the active layer 18. Although not shown, an n-type optical guide layer and a p-type optical guide layer may be made adjacent to the n-type cladding layer 16 and the p-type cladding layer 20, respectively. In the light emitting element shown in FIG. 1B, an n-type conductive layer 15 having a higher carrier concentration is provided between the buffer layer 14 and the n-type cladding layer 16.

As an important feature of the invention, an n-type region 24 is formed to extend from the surface of the multi-layered structure through the p-type contact layer 22, p-type cladding layer 20 and active layer 18 to the n-type cladding layer 16 or the n-type conductive layer 15.

Formed on the surface of the n-type region 24 is the n-side electrode 28. The p-side electrode 26 is formed on the surface of the p-type contact layer 22.

The light emitting element explained above has a flat surface, and does not need a step for making the n-side electrode as required in conventional light emitting elements. Therefore, light emitting elements shown in FIGS. 1A and 1B do not need the process for etching the semiconductor multi-layered structure to make a step. Removal of the step makes the process for stacking and patterning the n-side electrode easy, and improves the production yield.

The element having the p-side electrode 26 and the n-side electrode 28 on a common plane makes wire bonding easy.

The light emitting element also makes flip-chip mounting possible. Therefore, it can be mounted directly onto a packaging substrate without using bonding wires, and makes the assembling process much easier. Simultaneously, the light emitting element can be driven at a high speed by reducing driving loads such as electric resistance, electric capacitance and inductance. It is also possible to integrate and package a number of these light emitting elements in a high density on a packaging substrate to obtain a high-quality display device.

It is very important to reduce "leak current components" which leak from the n-type region 24 and laterally flow in the p-type contact layer 22, p-type cladding layer 20 and active layer 18 of the light emitting element 10. The Inventor found conditions for effectively restricting "leak current components". These conditions are explained below in detail.

The leak current components, that is, the current components which flow directly between the p-type contact layer 22, p-type cladding layer 20 or active layer 18 and the n-type region 24 depend on specific resistance values and thicknesses of these layers, and the distance between the p-side electrode 26 and the n-type region 24.

The mobility of a hole in gallium nitride is about 20 $cm^2/Vs$, and the mobility of an electron is about 200 $cm^2/Vs$. That is, the mobility of a hole is only one tenth of the mobility of an electron. It result from the fact that the effective mass of a hole is 0.8 to 1.0 $m_o$ which is larger than the effective mass of an electron, 0.2 $m_o$ (where $m_o$ is equal to the mass of an electron in vacuum and approximately $9.1 \times 10^{-28}$ grams).

Here is a review on specific resistance values. The p-type contact layer 22 has the highest specific resistance among the p-type contact layer 22, p-type cladding layer 20 and active layer 18 because the carrier concentration of the p-type contact layer 22 must be around $1 \times 10^{18}$ to $1 \times 10^{20}$ $cm^3$ to ensure good ohmic contact with the p-side electrode 26. Therefore, the problem of leak current components is most serious in the p-side contact layer 22, and it is most important to restrict leak current components in the p-type contact layer 22.

Through experiments made by the Inventor, the light emitting element according to the invention was confirmed to be remarkably effective in suppressing leak current components when the p-contact layer 22 had a specific resistance as high as at least a hundred times the specific resistance of the n-type cladding layer 16. When the distance between the n-type region 24 and the p-side electrode 26 is W (shown in FIG. 1) and the thickness of the p-type contact layer 22 is d, it was also confirmed preferable to satisfy W>100 d. That is, under these conditions, leak current components are reduced to 1/1000, and the element reliably operates even under the current of 100 mA.

That is, leak current components are reduced sufficiently, and a hole current supplied from the p-side electrode 26 to the p-type contact layer 22 flows vertically through the p-type contact layer 22 and the p-type layer 20 into the active layer 18. On the other hand, an electron current injected into the n-type region 24 via the n-side electrode 28 flows straight down through the n-type region 24 and enters into the n-type cladding layer 16 having a low specific resistance. Then, it is distributed uniformly in the lateral direction in the n-type cladding layer 16, and flows into the active layer 18 to cause uniform emission.

As shown in FIG. 1B, an n-type conductive layer 15 having a high carrier concentration may be formed between the buffer layer 14 and the n-type cladding layer 16, and the n-type region 24 may be made to extend into the conductive layer 15. Thus, an electron current injected into the n-type region 24 via the n-side electrode 28 flows straight down through the n-type region 24, then flows into and make a uniform distribution in the n-type conductive layer 15 with a very low specific resistance, and flows into the active layer 18 via the n-type cladding layer 16. As a result, remarkably uniform emission of light occurs.

In the light emitting element according to the invention, it is not necessary to make a separation groove between the n-type region 24 and the p-side electrode to insulate them from each other. That is, if a large amount of leak current components flows between the p-type contact layer 22, p-type layer 20 or active layer 18 and the p-type region 24, then a separation groove for separating them for the purpose of insulation must be made. However, making the best use of a high specific resistance of p-type gallium nitride semiconductors and optimizing the element structure as explained above, the invention successfully reduce leak current components. Therefore, the semiconductor element needs no separation groove, and simplify the element structure and the manufacturing process.

Next explained is a process for manufacturing the light emitting element 10A according to the invention.

FIGS. 2A through 2D and FIGS. 3A through 3D are cross-sectional views of the light emitting element 10A under fabrication by a manufacturing process.

Figure 2A:
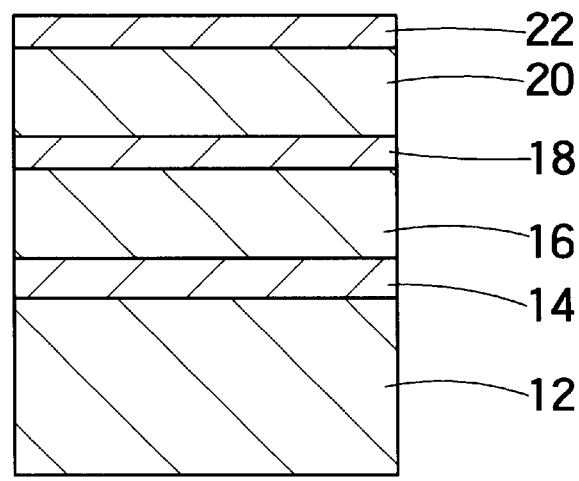
FIGS. 2A through 2D are cross-sectional views of a semiconductor light emitting element according to the invention in different steps of a manufacturing process.

First made on the sapphire substrate 12 are semiconductor layers 14 through 22 sequentially by epitaxial growth as shown in FIG. 2A. Metal-organic chemical vapor deposition (MOCVD) or molecular beam epitaxy (MBE), for example, may be used for the growth. The impurity doped into the p-type contact layer 22 is chosen from group II elements among which magnesium (Mg) is especially preferable. In order to ensure good ohmic contact as explained above, the impurity is preferably doped to make a carrier concentration about $1 \times 10^{18}$ cm$^{-3}$ to $1 \times 10^{20}$ cm$^{-3}$. The amount of magnesium actually doped must be about 100 times the carrier concentration because the p-type dopant in the gallium nitride semiconductor forms has the property of making a deep level and being not readily activated at ambient temperatures.

Figure 2B:
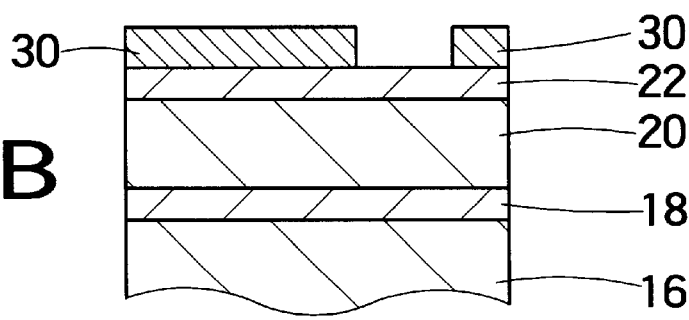

Next formed is the insulation film 30 on the uppermost layer 22 as shown in FIG. 2B. That is, silicon oxide, for example, is stacked and then patterned to make an aperture in a portion for making the n-type region.

Figure 2C:
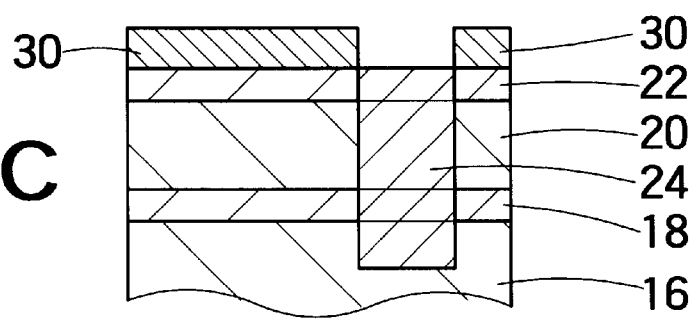

Next, as shown in FIG. 2C, hydrogen ions are implanted into the n-type region 24 using the insulation film 30 as a mask. This is done for inactivating the p-type dopant in the p-type contact layer 22 within the region. Since p-type dopants of group II elements, for example, are inactivated in gallium nitride by combination with hydrogen and become non-contributive to electric conduction. Therefore, by first ion-implanting hydrogen to inactivate the p-type dopant and then introducing the n-type impurity, the n-type region 24 with a high concentration can be made. The Inventor has confirmed by experiments that inactivation by hydrogen be apt to occur when using especially magnesium among group II elements as the p-type dopant. Thus, in the present invention, magnesium is preferably used as the dopant of the p-type layer 20 and the p-type contact layer 22. For implantation of hydrogen, the acceleration voltage is preferably 10 to 1000 keV, and the dose amount is preferably $1 \times 10^{13}$ through $1 \times 10^{17}$ ions per cm$^2$.

Figure 2D:
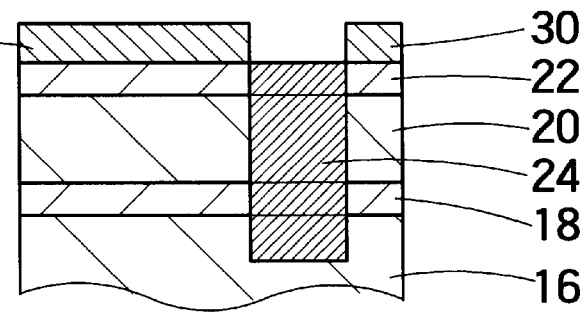

Next formed the n-type region 24 as shown in FIG. 2D. By introducing an n-type impurity through the aperture of the insolation film 30 down to the n-type layer 16, the n-type region 24 is formed. The n-type impurity may be chosen from group IV elements or group VI elements, for example. The inventor confirmed by experiments that silicon (Si), germanium (Ge), selenium (Se) or tellurium (Te) be preferable and that silicon be especially preferable among them because it makes it easy to realize a high carrier concentration of the n-type region.

To introduce the n-type impurity, ion implantation, vapor phase diffusion or solid phase diffusion may be used. Preferable conditions for ion implantation are: acceleration voltage of 10 to 1000 keV, and dose amount of $1 \times 10^{13}$ to $10^{17}$ ions per cm$^2$. After the dopant is introduced, the structure is preferably annealed at 400 to 1000° C. to recover any damage in the crystal and to activate the introduced dopant. When vapor phase diffusion is used, the diffusion temperature is preferably set to 600 to 1000° C.

By optimizing the conditions for annealing or diffusion after introduction of ions, the n-type dopant can be diffused gently not only in the depth direction of the multi-layered structure, i.e. in the thickness direction of the layers, but also laterally, i.e. along the plane of the layer to make a p-i-n-type junction. When the p-i-n junction is formed, an i-type layer with a high resistance is formed around the n-type region 24. Therefore, leak current between the n-type region 24 and the p-type contact layer 22 or p-type layer 20 can be reduced effectively.

Figure 3A:
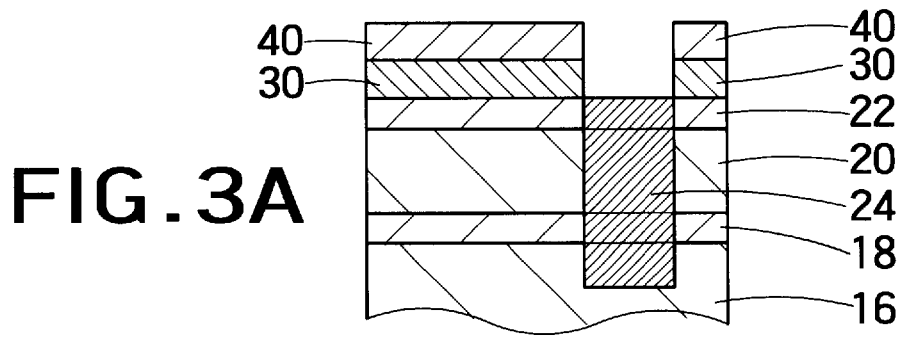
FIGS. 3A through 3D are cross-sectional views of a semiconductor light emitting element according to the invention in different steps of a manufacturing process.

Next formed is a resist pattern 40 as shown in FIG. 3A. That is, a resist is applied, and then patterned to form an aperture on the surface of the n-type region 24. The resist pattern is used as a mask for lift-off of the n-side electrode which is stacked later. The aperture of the resist 40 is preferably smaller than the aperture of the silicon oxide layer 30 so that the n-side electrode does not extend beyond the surface of the n-type region 24. In this manner, contact of the n-side electrode with the p-type semiconductor portion of the p-type contact layer 22 and short-circuit thereby can be prevented. Alternatively, a second insulation film (not shown) may be stacked on the oxide silicon film 30 to make an aperture smaller than the aperture of the silicon oxide film 30 and to apply and pattern the resist 40 later. In this case, the aperture of the second insulation film serves as a contact hole to the n-side electrode, which protects the surface the semiconductor layer and effectively prevents the n-side electrode from being short-circuited to the p-type semiconductor portion of the p-type contact layer 22.

Figure 3B:
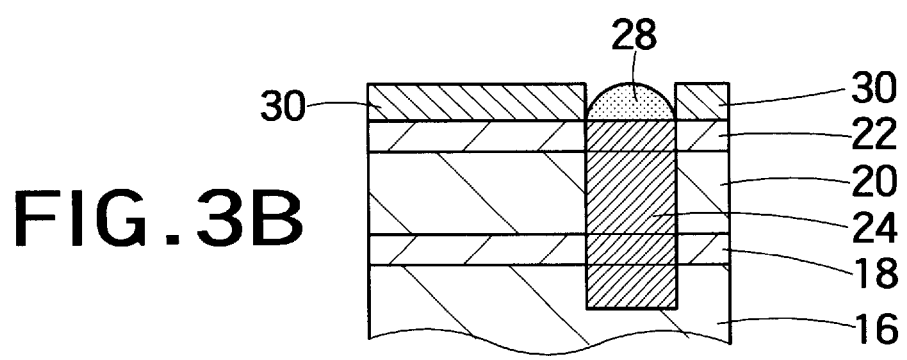

As shown in FIG. 3B, the n-side electrode 28 is formed subsequently. After stacking a material of the n-side electrode by sputtering or vacuum evaporation, the material is selectively removed by lift-off using the resist pattern 40. The structure is sintered by annealing to ensure reliable ohmic contact. Annealing may be done at 850° C. for 40 seconds, for example.

Figure 3C:
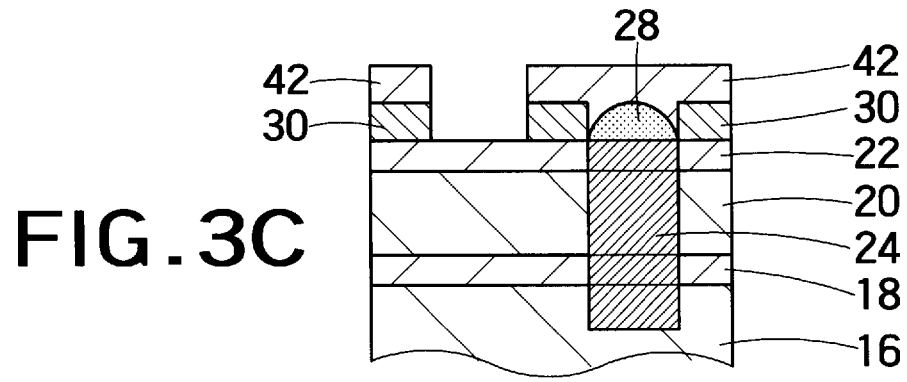

Next as shown in FIG. 3C, a contact aperture for the p-side electrode is made in the silicon oxide film 30. That is, a second resist pattern 42 is made. Using the resist pattern 42 as a mask, the silicon film 30 is etched by wet etching or dry etching to form the aperture. The second resist pattern 42 is used also as a lift-off mask of the p-side electrode explained later.

Figure 3D:
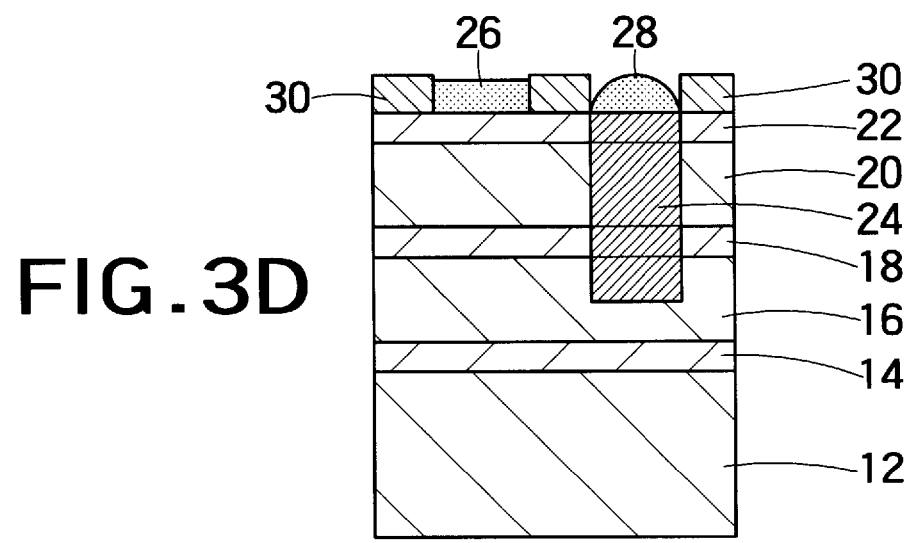

Thereafter, as shown in FIG. 3D, the p-side electrode 26 is formed. First stacking a material of the p-side electrode by sputtering or vacuum evaporation, the material is selectively removed by lift-off using the resist pattern 42. If necessary, the structure is subsequently annealed to make ohmic contact.

By the process explained above, the light emitting element 10 is completed. The product is subsequently separated by cleavage of scribing, and each light emitting element 10 is mounted on a stem or other element, and wires are bonded to the p-side electrode 26 and the n-side electrode 28 to complete a light emitting device. Alternatively, the light emitting element 10 may be packaged on a packaging substrate having formed an electrode pattern by flip-chip mounting.

Figure 4A:
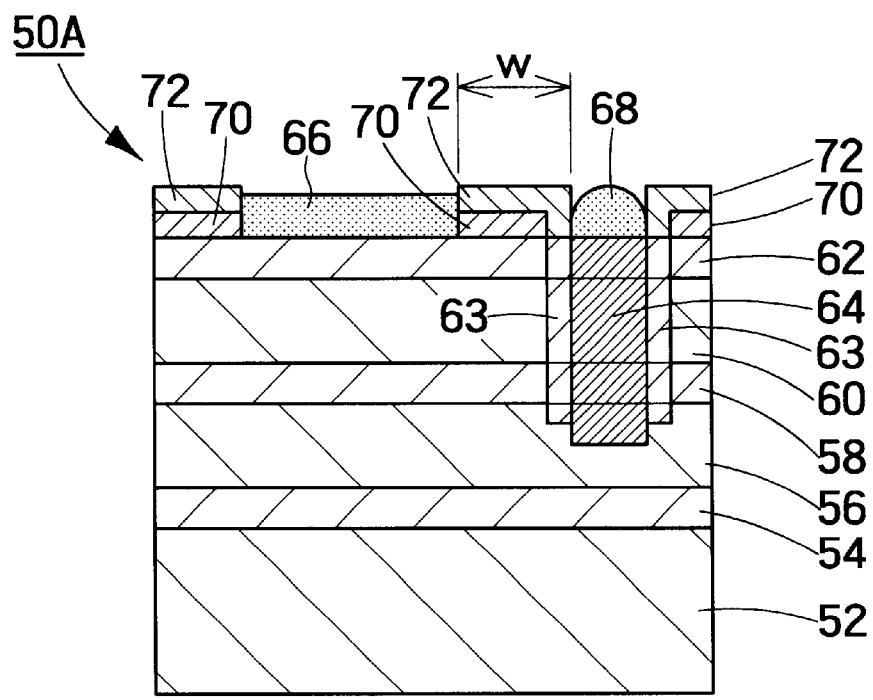
FIGS. 4A and 4B are cross-sectional views showing general constructions of semiconductor light emitting elements taken as the second embodiment of the invention.
Figure 4B:
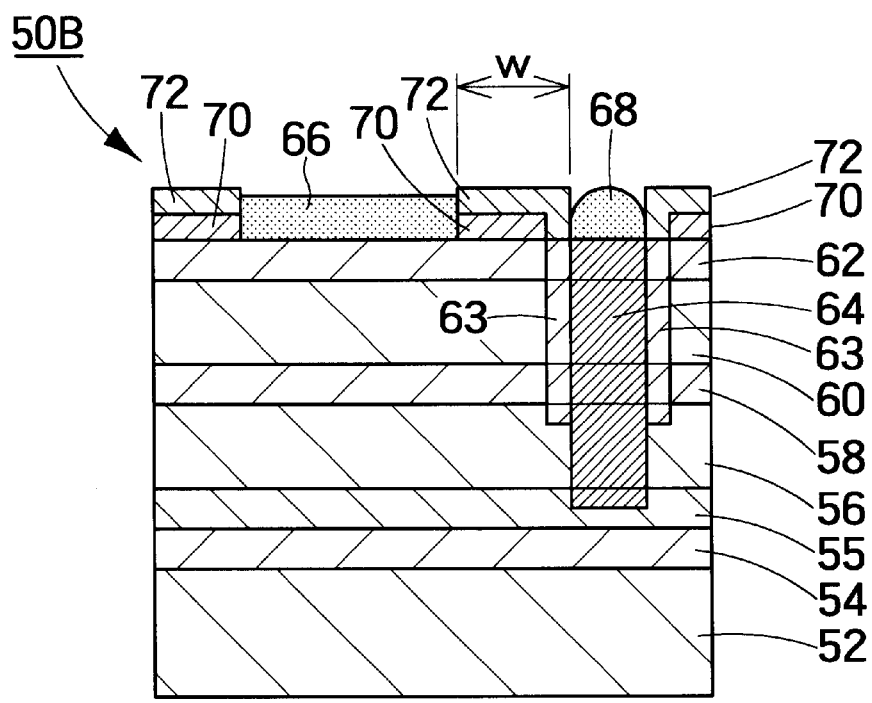

Next explained semiconductor light emitting elements taken as the second embodiment of the invention, with reference to FIGS. 4A and 4B which are their cross-sectional views.

Like the light emitting element 10 explained above, the light emitting element 50A shown in FIGS. 4A and 4B also has a multi-layered structure of semiconductors stacked on a sapphire substrate 52. More specifically, stacked on the sapphire substrate 52 are a buffer layer 54, n-type cladding layer 56, active layer 58, p-type cladding layer 60 and p-type contact layer 62 in the cited order. Roles and compositions of these layers are identical to those of the light emitting element 10 already explained above. The light emitting element 50B shown in FIG. 4B includes an n-type conductive layer 55 having a high carrier concentration between the buffer layer 54 and the n-type cladding layer 56.

Here again, an n-type region 64 is formed to extend from the surface of the multi-layered structure through the p-type contact layer 62, p-type cladding layer 60 and active layer 58 into the n-type cladding layer 56 or the n-type conductive layer 55.

In this embodiment, a high-resistance region 63 is formed outside the n-type region 64. The high-resistance region 63 surrounds the n-type region 64, departing from the surface of the p-type contact layer 62 at least to the depth of the n-type cladding layer 56. The high-resistance region 63 can be made by introducing hydrogen ions, for example. Formed on the surface of the n-type region 64 is the n-side electrode 68, and the p-side electrode 66 is formed on the p-type contact layer 62.

In the light emitting element 50 having the above-explained construction, the high-resistance region 63 surrounding the n-type region 64 effectively reduces leak current between the n-type region 64 and the p-type contact layer 62, p-type cladding layer 60 or active layer 58. Therefore, particular attention need not paid to determine specific resistances and thicknesses of the p-type contact layer and others to suppress leak current. That is, the resistance and the thickness of the p-type cladding layer 60 or the active layer 58 can be set freely, and the construction of the multi-layered structure can be more flexible.

The high-resistance region 63 also contributes to reducing leak current, not relying on increasing the distance W between the p-side electrode 66 and the n-side region 64. The use of the high-resistance region 63 makes it possible to decrease the distance W to a value equal to its width. As a result, the p-side electrode 66 can be enlarged to enlarge the light emitting portion, or the element size can be reduced.

In addition to these advantages unique to this embodiment, the light emitting element 50 also has the various effects explained with light emitting elements 10, namely, using no step and permitting both electrodes on a common plane. Also the light emitting element 50 need not have formed a separation groove between the n-type region 64 and the p-side electrode 66 to electrically insulate them from each other.

Next explained is a process for manufacturing the light emitting element 50 with reference to its cross-sectional views in FIGS. 5A through 5E and FIGS. 6A through 6D.

Figure 5A:
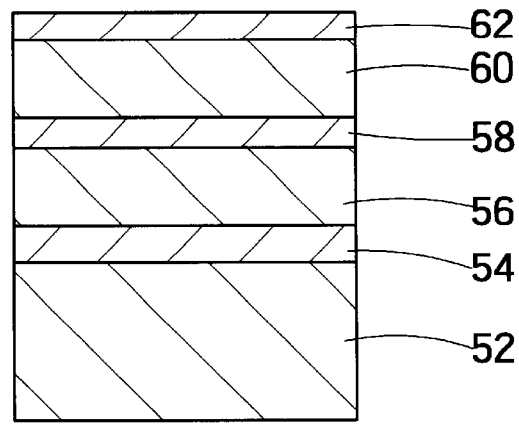
FIGS. 5A through 5E are cross-sectional views of a semiconductor light emitting element according to the second embodiment of the invention in different steps of a manufacturing process.

Here again, semiconductor layers 54 to 62 are epitaxially grown sequentially on the sapphire substrate 52 as shown in FIG. 5A. Crystal growth methods, compositions and thicknesses of individual layers already explained with reference to FIG. 2A also apply to the process explained here.

Figure 5B:
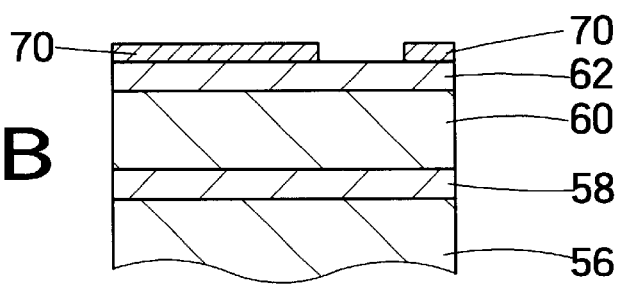
Figure 5C:
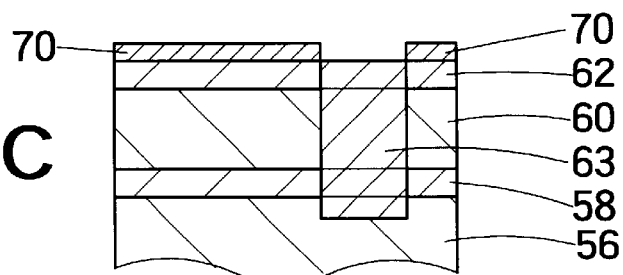

After that, as shown in FIG. 5B, a first insulation film 70 is stacked and patterned, and hydrogen ions are introduced as shown in FIG. 5C. Details of these steps are the same as those explained with reference to FIGS. 2B and 2C. That is, by introducing hydrogen, the acceptor impurity contained in the p-type semiconductor layers 60 and 62 can be inactivated to form a high resistance region.

Figure 5D:
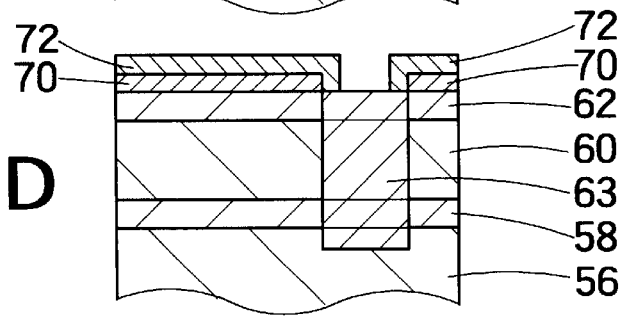
Figure 5E:
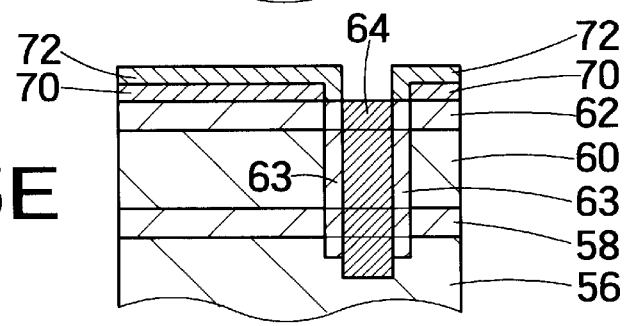
Figure 6A:
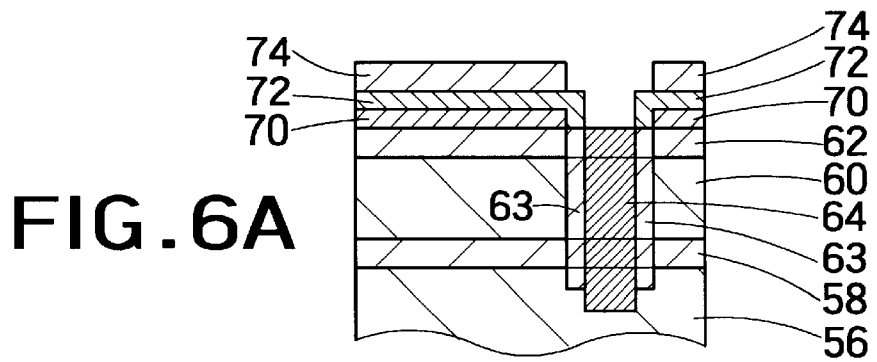
FIGS. 6A through 6D are cross-sectional views of a semiconductor light emitting element in different steps of a manufacturing process.
Figure 6B:
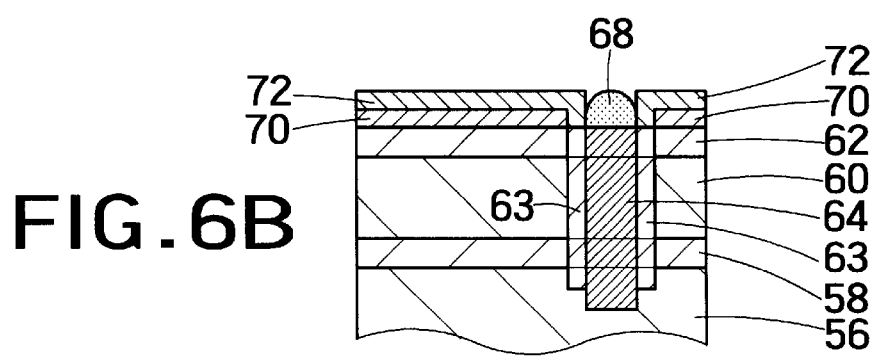
Figure 6C:
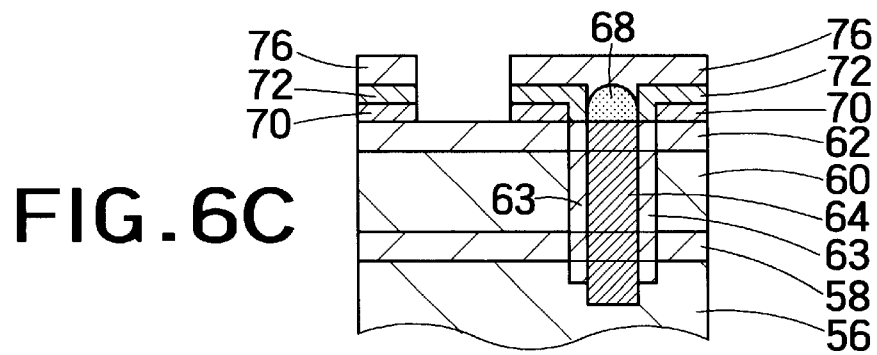
Figure 6D:
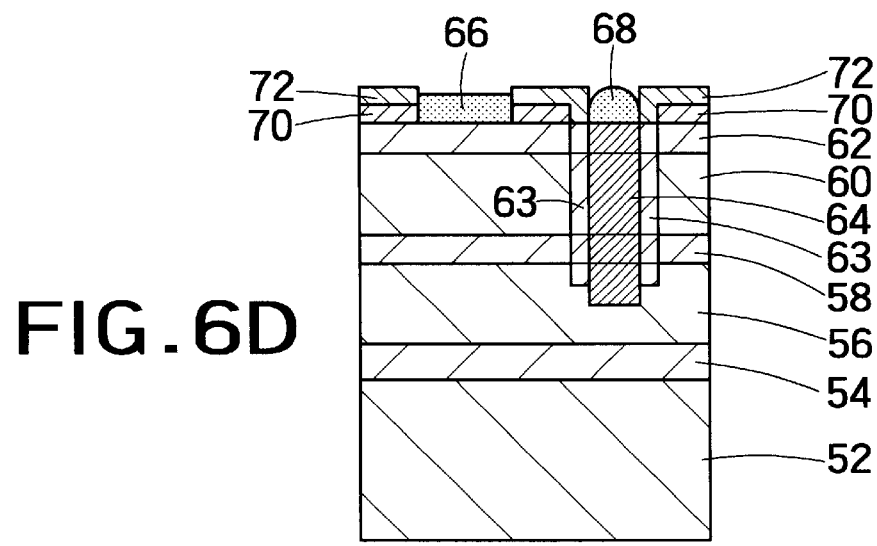

Next formed is a second insulation film 72 as shown in FIG. 5D. That is, an insulating material such as silicon oxide is stacked and patterned to form an aperture used to make the n-type region. It is important that the aperture be smaller than the aperture of the first insulation film 70. For patterning the second insulation film 72, any of wet etching and dry etching may be used.

Next using the second insulation film 72 as a mask, an n-type impurity is introduced into the n-type layer 56 to form the n-type region 64. Appropriate elements usable as the n-type impurity and conditions for making the region are the same as those explained with reference to FIG. 2D.

Also the steps shown in FIGS. 6A through 6D are the same as the steps shown in FIGS. 3A through 3D, and their explanation is omitted here.

It is important for the high-resistance region 63 to have a predetermined thickness to suppress leak current from the n-type region 64. The width of the high-resistance region 63 can be controlled by appropriately determining the diameter D1 of the aperture in the first insulation film 70 and the diameter D2 of the aperture in the second insulation film 72.

Unlike the steps shown in FIGS. 5A through 6D, the high-resistance region 63 around the n-type region 64 can be made by forming the aperture in the first insulation film 70, introducing hydrogen ions and n-type dopant simultaneously or successively, and then annealing the structure to let hydrogen preferentially extend along the plane of the film. In general, preferential diffusion of hydrogen is liable to occur because hydrogen has a larger diffusion coefficient than n-type dopants. In this manner, the high-resistance region 63 can be made around the n-type region 64 in self-alignment, which makes their positional control easier and simplifies the manufacturing process. In this case, by appropriately determining conditions for introducing hydrogen ions, conditions for introducing the n-type dopant and conditions for subsequent annealing, the within of the high-resistance region 63 around the n-type region 64 can be controlled.

In the embodiments shown in FIGS. 1A through 6D have been explained as sequentially stacking the n-type cladding layer, active layer, p-type cladding layer and p-type contact layer on the sapphire substrate. However, the invention is not limited to these embodiments, and involves other structures, such as one having optical guide layers between the active layer and the n-type cladding layer and/or between the active layer and the p-type cladding layer.

Also concerning the substrate, the invention may use various materials other than sapphire substrate, such as spinnel, $ScAlMgO_4$, $LaSrGaO_4$, (LaSr) (AlTa)$O_3$ and other insulating substrates, SiC, MgO, Si or other conductive substrates, and still attains corresponding effects. In this case, it is recommended to use the (001)-oriented surface in case of a $ScAlMgo_4$ substrate, and (111)-oriented surface in case of a (LaSr)(AlTa)$O_3$ substrate. a (111)-oriented surface.

Materials of respective semiconductor layers can be selected, as desired, from gallium nitride semiconductors having compositions expressed by $In_xAl_yGa_{1-x-y}$ ($0 \leq x \leq 1$, $0 \leq y \leq 1$, x+y+z=1).

The active layer may have a quantum well structure in which two or more kinds of thin semiconductor layers are stacked periodically. The n-type cladding layer and the p-type cladding layer may be made as graded layers gradually varying in refractive index, or may have multi-layered structures stacking layers having different carrier concentrations.

Light may be extracted to the exterior from the active layer either through the p-side electrode or through the substrate. Alternatively, polished surfaces may be made on opposite edges of the multi-layered structure to extract light from the active layer through the edges.

The light emitting elements illustrated in the drawings may be modified by inverting individual semiconductor layers on the substrate in conduction type. That is, p-type semiconductor layers may be first stacked on the sapphire substrate, to thereafter stack n-type semiconductor layers and to introduce a p-type dopant from the surface so as to make a p-type region.

Next explained are light emitting devices using a light emitting element according to the invention.

Figures 7A, 7B:
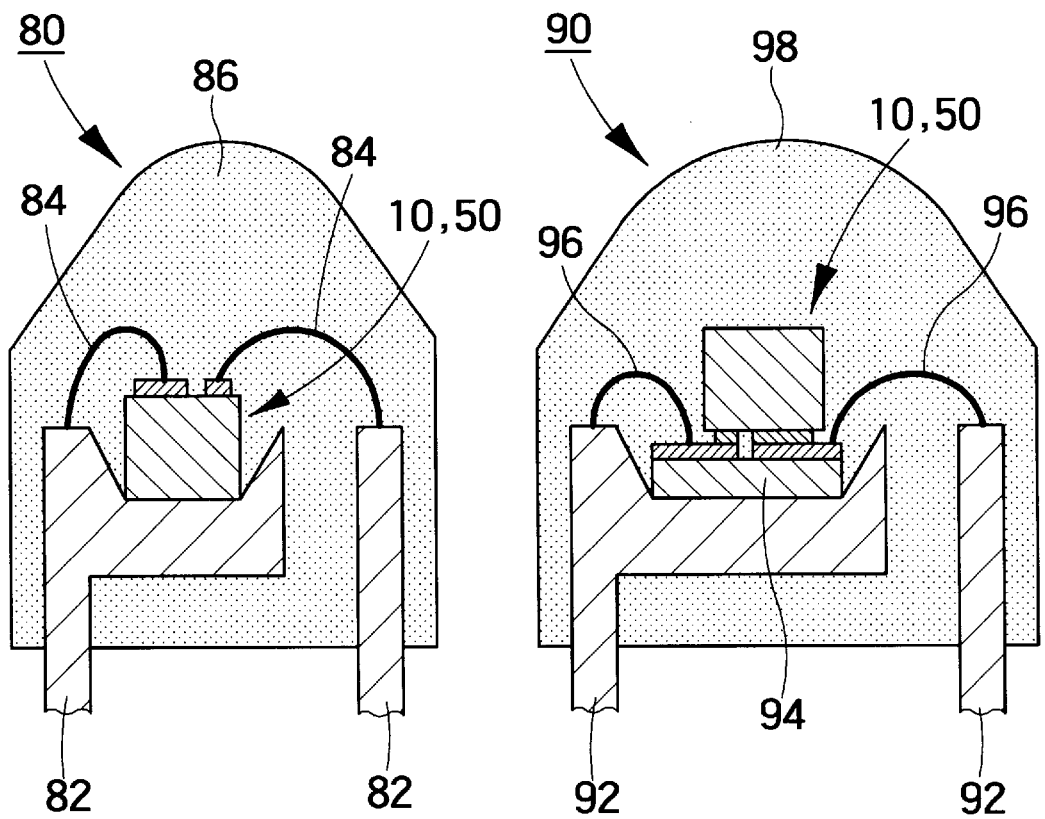
FIGS. 7A and 7B are cross-sectional views of light emitting devices using light emitting elements according to the invention.
Figure 8:
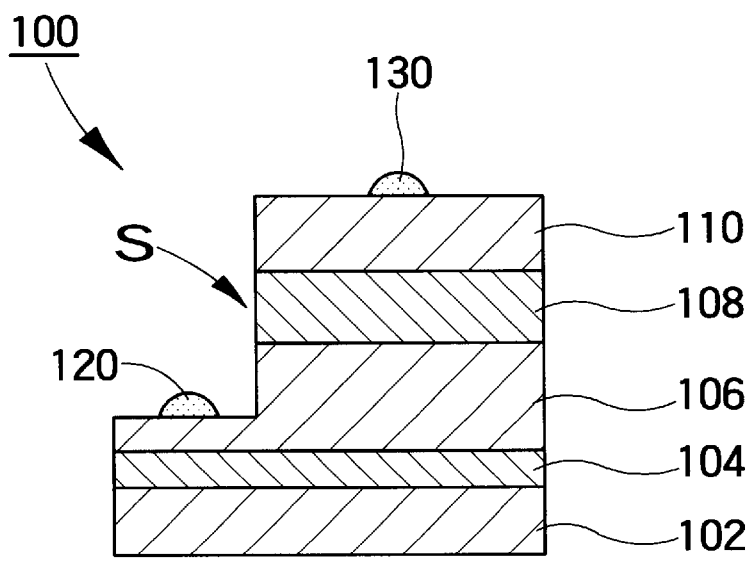
FIG. 8 is a cross-sectional view showing a general construction of a conventional blue light emitting element.

FIGS. 7A and 7B are cross-sectional views showing general constructions of light emitting devices embodying the invention. The light emitting device 80 shown in FIG. 7A is configured to connect wires to electrodes of the light emitting element 10 or 50. The light emitting device 90 shown in FIG. 7B is configured to mount the light emitting element 10 or 50 by flip-chip mounting.

In the light emitting device 80 of FIG. 7A, the light emitting element 10 or 50 according to the invention is mounted on the frame with its electrodes being faced upwardly. Wires 84, 84 are bonded to respective electrodes of the light emitting element, and the entirety is molded in a resin 86.

Even when the electrodes of the light emitting element are wire-bonded, the light emitting device 80 according to the invention having the p-side electrode and the n-side electrode on a common plane makes the wire bonding process much easier than conventional ones, and can be made more compact.

In the light emitting device 90 shown in FIG. 7B, a sub-mount 94 is mounted on a frame 92, and the light emitting element 10 or 50 according to the invention is mounted on the sub-mount 94 in a position facing its electrodes downwardly. Flip-chip mounting could not be realized with conventional light emitting elements having a step on their surfaces. The sub-mount 94 has formed a wiring pattern (not shown) to meet the electrode pattern of the light emitting element. The light emitting element is mounted by connecting its electrodes to the wiring pattern on the sub-mount 94. Then, after the wiring pattern on the sub-mount 94 is connected to electrode leads on the frame 92 with wires 96, 96, the entirety is molded in a resin.

With the light emitting device 90 packaging the light emitting element 10 or 50 by flip-chip mounting, light from the active layer can be extracted through the substrate. Therefore, the external quantum efficiency can be remarkably improved without disturbance by the electrodes. Additionally, because of omitting wire-bonding to electrodes of the light emitting element 10 or 50, the assembling process is simplified. Although FIG. 7B illustrates the use of wires 96, 96 to connect the wiring pattern on the sub-mount 94 to the leads on the frame 92, the shape of the sub-mount 94 and its wiring pattern may be modified to connect the wiring pattern directly to the leads on the frame. Thus, the wires 96, 96 need not be used, and the parasitic capacity and inductance caused by wires can be reduced further to realize a higher modulation speed of the device.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor light emitting element comprising:

a multi-layered structure including at least a substrate, a n-type cladding layer made of an n-type nitride compound semiconductor on said substrate, an active layer made of a nitride compound semiconductor on said n-type cladding layer, a p-type cladding layer made of a p-type nitride compound semiconductor on said active layer, and a p-type contact layer made of a p-type nitride compound semiconductor on said p-type cladding layer, and further including an n-type region made by selectively introducing an n-type dopant from a selective area of the surface of said p-type contact layer to extend from the surface of said multi-layered structure at least to said n-type cladding layer;

a first electrode formed in contact with the surface of said n-type region of said multi-layered structure;

a second electrode formed in contact with the surface of said p-type contact layer, said n-type region containing hydrogen which is implanted to inactivate a p-type dopant contained in said p-type contact layer and in said p-type cladding layer so that said p-type layer and said p-type cladding layer become non-contributive to electric conduction in said n-type region;

said p-type contact layer containing magnesium (Mg), and said n-type dogant in said n-type regions being selected from the group consisting of silicon (Si), Germanium (Ge), Selenium (Se) and tellurium (Te); and said p-type contact layer having a specific resistance at least as high as 1000 times the specific resistance of said n-type cladding layer, and W>100d being satisfied where d is the thickness of said p-type contact layer and W is the distance between said n-type region and said second electrode.

2. A semiconductor light emitting element comprising:

a multi-layered structure including at least a substrate, a n-type conduction layer made of an n-type nitride compound semiconductor on said substrate, an p-type nitride compound semiconductor on said substrate, an n-type cladding layer made of an n-type nitride compound semiconductor on said n-type conduction layer, an active layer made of a nitride compound semiconductor on said n-type cladding layer, a p-type cladding layer made of a p-type nitride compound semiconductor on said active layer, and a p-type contact layer made of a p-type nitride compound semiconductor on said p-type cladding layer, and further including an n-type region made by selectively introducing an n-type dopant from a selective area of the surface of said p-type contact layer to extend from the surface of said multi-layered structure at least to said n-type conduction layer;

a first electrode formed in contact with the surface of said n-type region of said multi-layered structure; and a second electrode formed in contact with the surface of said p-type contact layer, said n-type region containing hydrogen which is implanted to inactivate a p-type dopant contained in said p-type contact layer and in said p-type cladding layer so that said n-type contact layer and said p-type, said p-type contact layer having a specific resistance at least as high as 1000 times the specific resistance of said n-type conduction layer, and W>100d being satisfied where d is the thickness of said p-type contact layer and W is the distance between said n-type region and said second electrode.

3. A semiconductor light emitting element comprising: a multi-layered structure including at least a substrate, a layer made of an n-type nitride compound semiconductor on said substrate, an active layer made of a nitride compound semiconductor on said n-type cladding layer, and a layer made of a p-type nitride compound semiconductor on said active layer, and further including an n-type region made by selectively introducing an n-type dopant from a selective area of the surface of said multi-layered structure to extend from the surface of said multi-layered structure at least to said n-type nitride compound semiconductor layer, and a high-resistance region formed around said n-type region to block leak current flowing between said n-type region and said p-type nitride compound semiconductor;

a first electrode formed in contact with the surface of said n-type region of said multi-layered structure; and a second electrode formed in contact with the surface of said p-type contact layer, said n-type region and said high-resistance region containing hydrogen which is implanted to inactivated a p-type dopant contained in said layer made of a p-type nitride compound semiconductor so that said layer made of a p-type nitride compound semiconductor becomes non-contributive to electric conduction in said n-type region.

4. A semiconductor light emitting element comprising: a multi-layered structure including at least a substrate, an n-type cladding layer made of an n-type nitride compound semiconductor on said substrate, an active layer made of a nitride compound semiconductor on said n-type cladding layer, a p-type cladding layer made of a p-type nitride compound semiconductor on said active layer, and a p-type contact layer made of a nitride compound semiconductor on said p-type cladding layer, and further including an n-type region made by selectively introducing an n-type dopant from a selective area of the surface of said p-type contact layer to extend from the surface of said multi-layered structure at least to said n-type cladding layer; and a high-resistance region formed around said n-type region and said p-type contact layer, between said n-type region and said active layer;

a first electrode formed in contact with the surface of said n-type region of said multi-layered structure; and a second electrode formed in contact with the surface of said p-type contact layer, said n-type region and said high-resistance region containing hydrogen which is implanted to inactivate a p-type dopant contained in said p-type cladding layer and in said p-type contact layer so that said p-type cladding layer and said p-type contact layer become non-contributive to electric conduction in said n-type region, and said layers made of p-type nitride compound semiconductors containing magnesium (Mg), and said n-type dopant in said n-type region being selected from the group consisting of silicon (Si), germanium (Ge), selenium (Se) and tellurium (Te).

5. The semiconductor light emitting element according to claim 4 wherein said layers made of p-type nitride compound semiconductors contain magnesium (Mg), and said n-type dopant in said n-type region is selected from the group consisting of silicon (Si), germanium (Ge), selenium (Se) and tellurium (Te).

6. A semiconductor light emitting element comprising:

a multi-layered structure including at least a substrate, a layer made of an n-type nitride compound semiconductor on said substrate, an active layer made of a nitride compound semiconductor on said n-type cladding layer, and a layer made of a p-type nitride compound semiconductor on said active layer, and further including an n-type region made by selectively introducing an n-type dopant from a selective area of the surface of said multi-layered structure to extend from the surface of said multi-layered structure at least to said n-type nitride compound semiconductor layer, and a high-resistance region formed around said n-type region to block leak current flowing between said n-type region and said p-type nitride compound semiconductor;

a first electrode formed in contact with the surface of said n-type region of said multi-layered structure; and a second electrode formed in contact with the surface of said p-type contact layer, said n-type region and said high-resistance region containing hydrogen which is implanted to inactivate a p-type dopant contained in said layer made of a p-type nitride compound semiconductor so that said layer made of a p-type nitride compound semiconductor becomes non-contributive to electric conduction in said n-type region, and said n-type region and said high-resistive region being formed by selectively introducing said hydrogen from a surface of said multi-layered structure and by selectively introducing said n-type dopant from a surface of said multi-layered structure.

7. A semiconductor light emitting element comprising:

a multi-layered structure including at least a substrate, a n-type conduction layer made of an n-type nitride compound semiconductor on said substrate, an p-type nitride compound semiconductor on said substrate, an n-type cladding layer made of an n-type nitride compound semiconductor on said n-type conduction layer, an active layer made of a nitride compound semiconductor on said n-type cladding layer, a p-type cladding layer made of a p-type nitride compound semiconductor on said active layer, and a p-type contact layer made of a p-type nitride compound semiconductor on said p-type cladding layer, and further including an n-type region made by selectively introducing an n-type dopant from a selective area of the surface of said p-type contact layer to extend from the surface of said multi-layered structure at least to said n-type conduction layer;

a first electrode formed in contact with the surface of said n-type region of said multi-layered structure; and a second electrode formed in contact with the surface of said p-type contact layer, and said n-type region containing hydrogen which is implanted to inactivate a p-type dopant contained in said p-type contact layer and in said p-type cladding layer so that said p-type contact layer and said p-type cladding layer become non-contributive to electric conduction in said n-type region; and said p-type contact layer having a specific resistance at least as high as 1000 times the specific resistance of said n-type conduction layer, and W>1000d being satisfied where d is the thickness of said p-type contact layer and W is the distance between said n-type region and said second electrode.

* * * * *

UNITED STATES PATENT AND TRADEMARK OFFICE
CERTIFICATE OF CORRECTION

PATENT NO. : 6,278,136 B1  
DATED : August 21, 2001  
INVENTOR(S) : Nitta

Page 1 of 1

It is certified that error appears in the above-identified patent and that said Letters Patent is hereby corrected as shown below:

Column 12, claim 1,
Lines 5-6, change "a n-type" to -- an n-type --.

Column 12, claim 2,
Lines 40-41, change "a n-type" to -- an n-type --;
Line 42, change "an p-type" to -- a p-type --; and
Line 64, change "n-type" to -- p-type --.

Column 13, claim 3,
Line 25, change "to inactivated" to -- to inactivate --.

Column 14, claim 7,
Line 34-35, change "a n-type" to -- an n-type --;
Line 36, change "an p-type" to -- a p-type --; and
Line 62, change "W>1000d" to -- W>100d --.

Signed and Sealed this

Twelfth Day of March, 2002

Attest:

Attesting Officer

JAMES E. ROGAN
Director of the United States Patent and Trademark Office